(12) United States Patent
Moriya et al.

(10) Patent No.: US 9,030,005 B2
(45) Date of Patent: May 12, 2015

(54) SEMICONDUCTOR DEVICE

(71) Applicant: Murata Manufacturing Co., Ltd., Nagaokakyo-shi, Kyoto-fu (JP)

(72) Inventors: Yoichi Moriya, Nagaokakyo (JP);
Tetsuo Kanamori, Nagaokakyo (JP);
Yukihiro Yagi, Nagaokakyo (JP);
Yasutaka Sugimoto, Nagaokakyo (JP);
Takahiro Takada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/776,752

(22) Filed: Feb. 26, 2013

(65) Prior Publication Data
US 2014/0070394 A1   Mar. 13, 2014

Related U.S. Application Data

(63) Continuation of application No. PCT/JP2011/068851, filed on Aug. 22, 2011.

(30) Foreign Application Priority Data

Aug. 27, 2010 (JP) .................. 2010-190332

(51) Int. Cl.
*H01L 23/34* (2006.01)
*H01L 23/373* (2006.01)
(Continued)

(52) U.S. Cl.
CPC ............ *H01L 23/34* (2013.01); *H01L 23/3735* (2013.01); *H01L 23/5383* (2013.01);
(Continued)

(58) Field of Classification Search
USPC .................. 257/678, 712, 717, 720, 737, 738
See application file for complete search history.

(56) References Cited

U.S. PATENT DOCUMENTS 5,838,545 A * 11/1998 Clocher et al. ................. 361/719
5,930,601 A * 7/1999 Cannizzaro et al. ........... 438/122
(Continued)

FOREIGN PATENT DOCUMENTS

CN   100449745 C   1/2009
CN   100449753 C   1/2009
(Continued)

OTHER PUBLICATIONS

Official Communication issued in International Patent Application No. PCT/JP2011/068851, mailed on Nov. 22, 2011.
(Continued)

*Primary Examiner* — Zandra Smith
*Assistant Examiner* — John M Parker
(74) *Attorney, Agent, or Firm* — Keating & Bennett, LLP

(57) ABSTRACT

In a semiconductor device including a semiconductor element that produces heat and a substrate on which the semiconductor element is mounted, functions of the substrate are divided between a heat dissipating substrate and a wiring substrate. The heat dissipating substrate has a relatively high thermal conductivity, and includes principal surfaces defined by electric insulators, one of which is provided with an outer conductor located thereon. The wiring substrate is mounted on the upper principal surface of the heat dissipating substrate, has a thermal conductivity lower than that of the heat dissipating substrate, and includes a wiring conductor made mainly of silver or copper and located inside the wiring substrate, the wiring conductor being electrically connected to the outer conductor. The semiconductor element is mounted on the upper principal surface of the heat dissipating substrate and disposed in a through hole of the wiring substrate.

20 Claims, 3 Drawing Sheets

(51) Int. Cl.
*H01L 23/538* (2006.01)
*H01L 25/07* (2006.01)
*H01L 25/16* (2006.01)
*H01L 23/00* (2006.01)

(52) U.S. Cl.
CPC .......... *H01L23/5389* (2013.01); *H01L 25/072* (2013.01); *H01L 25/16* (2013.01); *H01L 2224/48157* (2013.01); *H01L 2224/73265* (2013.01); *H01L 2924/09701* (2013.01); *H01L 24/48* (2013.01); *H01L 2924/01019* (2013.01); *H01L 2224/48227* (2013.01); *H01L 2224/32225* (2013.01); *H01L 24/06* (2013.01); *H01L 24/32* (2013.01); *H01L 2224/48101* (2013.01)
USPC ............................ 257/717; 257/720; 257/738

(56) References Cited

U.S. PATENT DOCUMENTS

| | | | | |
|---|---|---|---|---|
| 6,890,798 | B2 * | 5/2005 | McMahon | 438/122 |
| 7,161,807 | B2 * | 1/2007 | Ishikawa et al. | 361/708 |
| 7,224,062 | B2 * | 5/2007 | Hsu | 257/737 |
| 7,433,187 | B2 * | 10/2008 | Ishikawa et al. | 361/688 |
| 7,911,051 | B2 * | 3/2011 | Ingenbleek et al. | 257/712 |
| 8,198,539 | B2 * | 6/2012 | Otoshi et al. | 174/252 |
| 2001/0036065 | A1 * | 11/2001 | Hirano et al. | 361/760 |
| 2002/0185718 | A1 * | 12/2002 | Mikubo et al. | 257/678 |
| 2003/0146508 | A1 * | 8/2003 | Chen et al. | 257/738 |
| 2004/0016748 | A1 * | 1/2004 | Kinoshita et al. | 219/552 |
| 2004/0173901 | A1 | 9/2004 | Mallik et al. | |
| 2004/0208210 | A1 * | 10/2004 | Inoguchi | 372/36 |
| 2007/0240900 | A1 * | 10/2007 | Yokomaku | 174/262 |

FOREIGN PATENT DOCUMENTS

| | | |
|---|---|---|
| JP | 61-212045 A | 9/1986 |
| JP | 2-177589 A | 7/1990 |
| JP | 04-142068 A | 5/1992 |
| JP | 05-315467 A | 11/1993 |
| JP | 2003-338579 A | 11/2003 |
| JP | 2004-146818 A | 5/2004 |
| JP | 2010-186881 A | 8/2010 |

OTHER PUBLICATIONS

Official Communication issued in corresponding Japanese Patent Application No. 2012-530656, mailed on Apr. 8, 2014.
English Translation of Official Communication issued in corresponding Chinese Patent Application No. 201180041371.9, mailed on Feb. 10, 2015.
Official Communication issued in corresponding Chinese Patent Application No. 201180041371.9, mailed on Feb. 10, 2015.

* cited by examiner

SEMICONDUCTOR DEVICE

BACKGROUND OF THE INVENTION

1. Field of the Invention

The present invention relates to a semiconductor device, and particularly to a semiconductor device that includes a semiconductor element that produces heat during operation and a substrate including the semiconductor element mounted thereon.

2. Description of the Related Art

To efficiently allow heat produced by a semiconductor element included in a semiconductor device to escape, a substrate of low thermal resistance is used as a substrate for mounting the semiconductor element thereon. Examples of the substrate of low thermal resistance currently in practical use include a metal base substrate formed by a metal plate of high thermal conductivity, and high temperature co-fired ceramic (HTCC) substrates, such as an aluminum nitride substrate and an alumina substrate.

For example, Japanese Unexamined Patent Application Publication No. 61-212045 describes a technique in which a ceramic multilayer wiring substrate having a hole and a radiating fin (metal plate) having a protrusion are combined together, with the protrusion fitted in the hole, and a semiconductor element is mounted on the protrusion of the radiating fin (metal plate) to improve heat dissipation of the semiconductor element.

However, the technique described in Japanese Unexamined Patent Application Publication No. 61-212045 cannot be applied to the case where a semiconductor element to be mounted is, for example, a field-effect transistor (FET) that requires input and output of signals through its lower surface. This is because, if a plurality of semiconductor elements are directly mounted on the single radiating fin (metal plate), each of the semiconductor elements cannot input and output signals through its lower surface.

Japanese Unexamined Patent Application Publication No. 5-315467 describes a technique in which a second substrate of high thermal conductivity is disposed in a hole or notch of a first insulating substrate, and a semiconductor element is mounted on the second substrate to improve heat dissipation of the semiconductor element. With the technique described in Japanese Unexamined Patent Application Publication No. 5-315467, if an insulating substrate is used as the second substrate, a semiconductor element that requires input and output of signals through its lower surface can be mounted on the second substrate.

However, the technique described in Japanese Unexamined Patent Application Publication No. 5-315467 cannot fully support higher current that has been demanded in recent years. An FET that has been recently developed using SiC or GaN semiconductor has a heat resistance temperature as high as 300° C. or 500° C. Although high current can be supplied in this case, the technique described in Japanese Unexamined Patent Application Publication No. 5-315467 cannot fully support such high current. The reasons for this are as follows.

The insulating substrate used in the technique described in Japanese Unexamined Patent Application Publication No. 5-315467 is an HTCC substrate made of, for example, aluminum nitride or alumina having a sintering temperature of about 1600° C. For simultaneous firing with the insulating substrate, the material used to form a wiring conductor in the insulating substrate needs to be metal having a relatively high melting point, such as tungsten or molybdenum. However, metal having a relatively high melting point, such as tungsten or molybdenum, has a high electrical resistivity and is not suitable for higher current.

To realize supply of high current using metal having a high electrical resistivity, it is necessary to increase the cross-sectional area of the wiring conductor. This hinders downsizing of the semiconductor device.

In the case of metal having a relatively low electrical resistivity, such as silver or copper, high current can be supplied even when the cross-sectional area of the wiring conductor is relatively small. However, since the melting point of such metal is lower than the sintering temperature of the HTCC substrate, simultaneous firing with the HTCC substrate is not possible. If the wiring conductor is one that is to be added to the existing substrate surface, metal, such as silver or copper, may be used as a material of the wiring conductor. However, if the wiring conductor made of metal, such as silver or copper, is formed only on the substrate surface, the resulting increase in substrate area leads to an increased size of the semiconductor device.

The same applies to the technique described in Japanese Unexamined Patent Application Publication No. 61-212045. Since an alumina substrate is used as the ceramic multilayer wiring substrate described in Japanese Unexamined Patent Application Publication No. 61-212045, metal of low resistivity, such as silver or copper, cannot be used to form the internal wiring conductor.

SUMMARY OF THE INVENTION

Preferred embodiments of the present invention provide a semiconductor device that has high heat dissipating characteristics, supports higher current, and has a reduced size.

A semiconductor device according to a preferred embodiment of the present invention includes a heat dissipating substrate having a relatively high thermal conductivity, the heat dissipating substrate including at least one principal surface defined by an electric insulator provided with an outer conductor thereon; a wiring substrate mounted on the one principal surface of the heat dissipating substrate, having a thermal conductivity lower than that of the heat dissipating substrate, and including a wiring conductor made mainly of silver or copper and located inside the wiring substrate, the wiring conductor being electrically connected to the outer conductor; and a semiconductor element that produces heat during operation, mounted on the one principal surface of the heat dissipating substrate, and including a lower-surface electrode located on a mounting surface facing the one principal surface of the heat dissipating substrate, the lower-surface electrode being electrically connected via the outer conductor to the wiring conductor.

In brief, a preferred embodiment of the present invention divides the functions of a substrate between the heat dissipating substrate and the wiring substrate, makes it possible to use different materials suitable for the heat dissipating substrate and the wiring substrate, and solves the problems with the related art described above.

The heat dissipating substrate preferably includes, for example, any one of an aluminum nitride substrate, an alumina substrate, a silicon nitride substrate, and a metal base substrate including a metal plate including a ceramic or resin insulating layer on at least one of principal surfaces thereof. The wiring substrate preferably is, for example, either a low temperature co-fired ceramic (LTCC) substrate or a resin substrate.

In a preferred embodiment of the present invention, the wiring substrate and the semiconductor element may be separately disposed on the heat dissipating substrate. However, it is preferable that the wiring substrate include a through hole passing therethrough in a direction perpendicular or substantially perpendicular to the direction of the principal surface, and that the semiconductor element be disposed in the through hole. In this case, it is more preferable that there be a plurality of semiconductor elements and a plurality of through holes, and that the plurality of semiconductor elements be disposed in the respective through holes.

It is preferable that the semiconductor element include an upper-surface electrode on a surface opposite the mounting surface, and that the upper-surface electrode be electrically connected to the wiring conductor via a wire.

A preferred embodiment of the present invention is more advantageously applied when the semiconductor element has a heat resistance temperature of about 200° C. or higher, for example.

A preferred embodiment of the present invention is more advantageously applied when the semiconductor element is of bare type, for example.

A preferred embodiment of the present invention is more advantageously applied when an electronic component is mounted on a principal surface of the wiring substrate, for example.

According to various preferred embodiments of the present invention, since the semiconductor element is mounted on the heat dissipating substrate having a relatively high thermal conductivity, it is possible to ensure high heat dissipating characteristics.

The outer conductor is preferably located on the electric insulator of the heat dissipating substrate, and is electrically connected to the wiring conductor in the wiring substrate. Therefore, a signal from or to the lower-surface electrode on the semiconductor element can be sent out or in via the outer conductor.

The outer conductor is preferably electrically connected to the wiring conductor in the wiring substrate, and the wiring conductor preferably is made mainly of silver or copper, for example. Therefore, it is possible to realize low-resistance wiring and fully support higher current.

Since the wiring conductor is preferably located inside the wiring substrate, the size of the wiring conductor that needs to be disposed on the surface of the wiring substrate is significantly reduced. It is thus possible to fully support downsizing.

Heat from the semiconductor element is substantially dissipated from the heat dissipating substrate and is less likely to be transferred to the wiring substrate. Also, the wiring substrate has a thermal conductivity lower than that of the heat dissipating substrate. Thus, since there is no significant increase in temperature on the outer surface of the wiring substrate, a heat-sensitive electronic component can be mounted on the outer surface of the wiring substrate without problems.

In a preferred embodiment of the present invention, if the wiring substrate includes a through hole passing therethrough in a direction perpendicular or substantially perpendicular to the direction of the principal surface, and the semiconductor element is disposed in the through hole, the entire region around the through hole in the wiring substrate can be used as wiring for the semiconductor element, so that efficient wiring can be realized in the wiring substrate. Additionally, since a space beside the semiconductor element can be effectively used, it is possible to reduce the size of the semiconductor element.

In the case described above, if there are a plurality of semiconductor elements and a plurality of through holes, and the plurality of semiconductor elements are disposed in the respective through holes, wiring between the plurality of semiconductor elements can be efficiently realized in the wiring substrate.

If the semiconductor element includes an upper-surface electrode on a surface opposite the mounting surface, and the upper-surface electrode is electrically connected to the wiring conductor via a wire, it is possible to achieve a connection between the upper-surface electrode and the wiring conductor without causing an increase in size of the semiconductor device.

As in the case of the semiconductor element being an FET which is made of SiC or GaN semiconductor, for example, if the semiconductor element has a heat resistance temperature of about 200° C. or higher, particularly high current can be supplied to the semiconductor element. Even in such a case, since the wiring substrate includes the wiring conductor preferably made mainly of silver or copper having a relatively low electrical resistivity, it is possible to fully support higher current. Also, since the wiring conductor can be disposed inside the wiring substrate, it is possible to fully support downsizing.

When an electronic component is mounted on a principal surface of the wiring substrate, the wiring substrate having a relatively low thermal conductivity can reduce transfer of heat from the semiconductor element. Therefore, an electronic component having a low heat resistance temperature can be disposed near the semiconductor element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
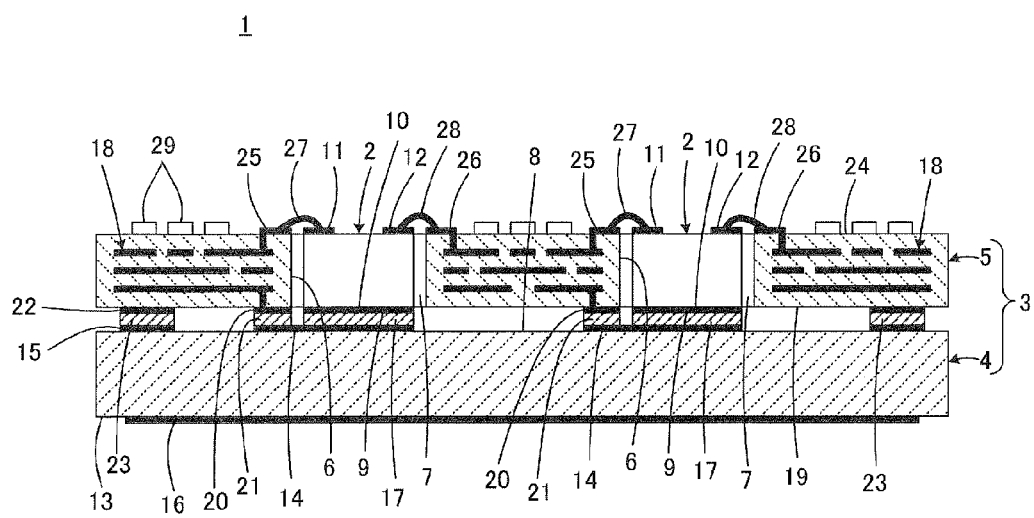
FIG. 1 is a cross-sectional view of a semiconductor device according to a first preferred embodiment of the present invention.

A semiconductor device 1 according to a first preferred embodiment of the present invention will now be described with reference to FIG. 1 to FIG. 4. FIG. 1 is an enlarged view as compared to FIG. 2 to FIG. 4. The cross section illustrated in FIG. 1 corresponds to a cross section taken along line A-A in FIG. 2.

As illustrated in FIG. 1, a semiconductor device 1 includes a plurality of semiconductor elements 2 and a substrate assembly 3 to mount the semiconductor elements 2. The substrate assembly 3 is an integrated combination of a heat dissipating substrate 4 and a wiring substrate 5.

The wiring substrate 5 includes a plurality of through holes 6 passing therethrough in a direction perpendicular or substantially perpendicular to the principal surface direction. The semiconductor elements 2 described above are disposed in the respective through holes 6. In the illustrated present preferred embodiment, as can been seen from FIG. 4, the wiring substrate 5 preferably includes four through holes 6, for example. For example, if the semiconductor elements 2 have dimensions of about 10 mm by about 10 mm in plan view, the through holes 6 preferably have dimensions of about 11 mm by about 11 mm in plan view. That is, the through holes 6 are made larger than the semiconductor elements 2, so that a predetermined gap 7 is created between the inner periphery which defines each through hole 6 and the outer periphery of the corresponding semiconductor element 2.

The semiconductor elements 2 produce heat during operation and are, for example, field-effect transistors (FETs) of bare type. Each of the semiconductor elements 2 includes a lower-surface electrode 10 on a mounting surface 9 (i.e., lower surface) facing an upper principal surface 8 of the heat dissipating substrate 4, and also includes two upper-surface electrodes 11 and 12 on a surface (i.e., upper surface) opposite the mounting surface 9. The lower-surface electrode 10 defines and serves as a drain electrode, and the two upper-surface electrodes 11 and 12 define and serve as a source electrode and a gate electrode.

The heat dissipating substrate 4 preferably is an HTCC substrate, such as an aluminum nitride substrate, an alumina substrate, or a silicon nitride substrate, for example. The heat dissipating substrate 4 preferably has a thermal conductivity of about 10 W/(m·K) or more, for example. Since the heat dissipating substrate 4 preferably is an HTCC substrate as described above, the upper principal surface 8 and a lower principal surface 13 of the heat dissipating substrate 4 are preferably defined by electric insulators.

Figure 2:
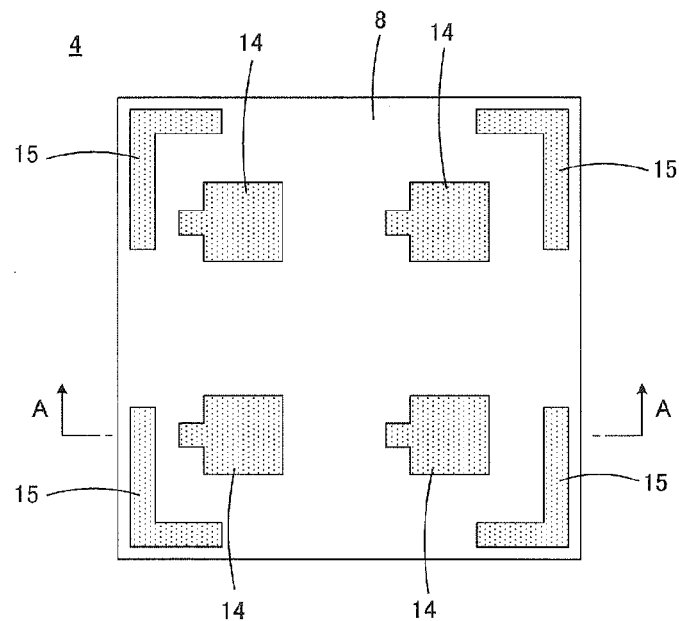
FIG. 2 is a top view of a heat dissipating substrate included in the semiconductor device illustrated in FIG. 1.
Figure 3:
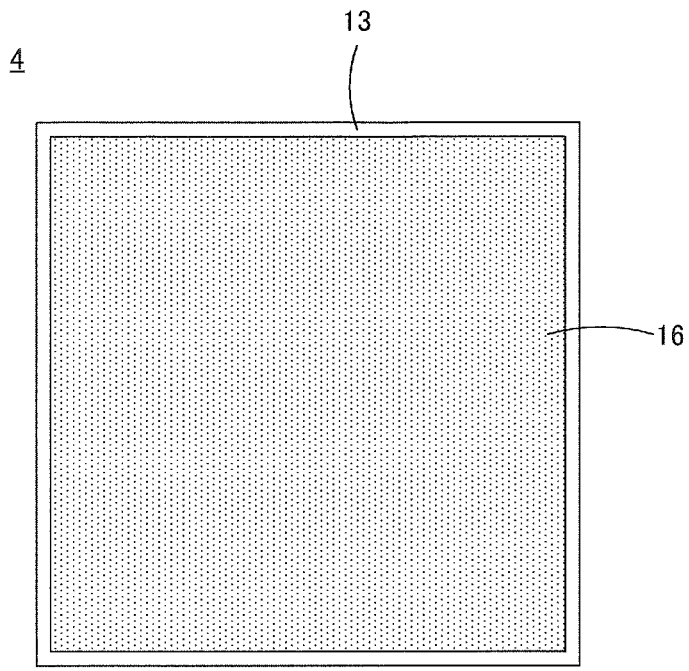
FIG. 3 is a bottom view of the heat dissipating substrate illustrated in FIG. 2.

As illustrated in FIG. 1 and FIG. 2, for example, four outer conductors 14 and four bonding pads 15 are preferably arranged to bond to the wiring substrate 5 on the upper principal surface 8 of the heat dissipating substrate 4. The four outer conductors 14 are electrically insulated from one another. As illustrated in FIG. 1 and FIG. 3, a bonding pad 16 to bond to a motherboard or chassis (not shown) is disposed over the entire or substantially the entire lower principal surface 13 of the heat dissipating substrate 4.

For example, the heat dissipating substrate 4 preferably is about 0.635 mm thick, and the outer conductors 14 and the bonding pads 15 and 16 preferably are each about 0.3 mm thick. The outer conductors 14 and the bonding pads 15 and 16 are preferably made mainly of, for example, copper or aluminum.

The semiconductor elements 2 are mounted on the upper principal surface 8 of the heat dissipating substrate 4. Specifically, for each of the four semiconductor elements 2, the lower-surface electrode 10 is electrically connected to the corresponding outer conductor 14 on the heat dissipating substrate 4, preferably with a conductive bonding material 17, such as solder, interposed therebetween.

The wiring substrate 5 is mounted on the upper principal surface 8 of the heat dissipating substrate 4. The wiring substrate 5 preferably is, for example, an LTCC substrate or a resin substrate. The wiring substrate 5 has a thermal conductivity lower than that of the heat dissipating substrate 4. For example, the wiring substrate 5 has a thermal conductivity of about 5 W/(m·K) or less, preferably about 3 W/(m·K) or less, for example. A wiring conductor 18 made mainly of silver or copper is preferably disposed in the wiring substrate 5. The wiring substrate 5 preferably has a laminated structure. Most of the wiring conductor 18 preferably is disposed inside the wiring substrate 5.

Figure 4:
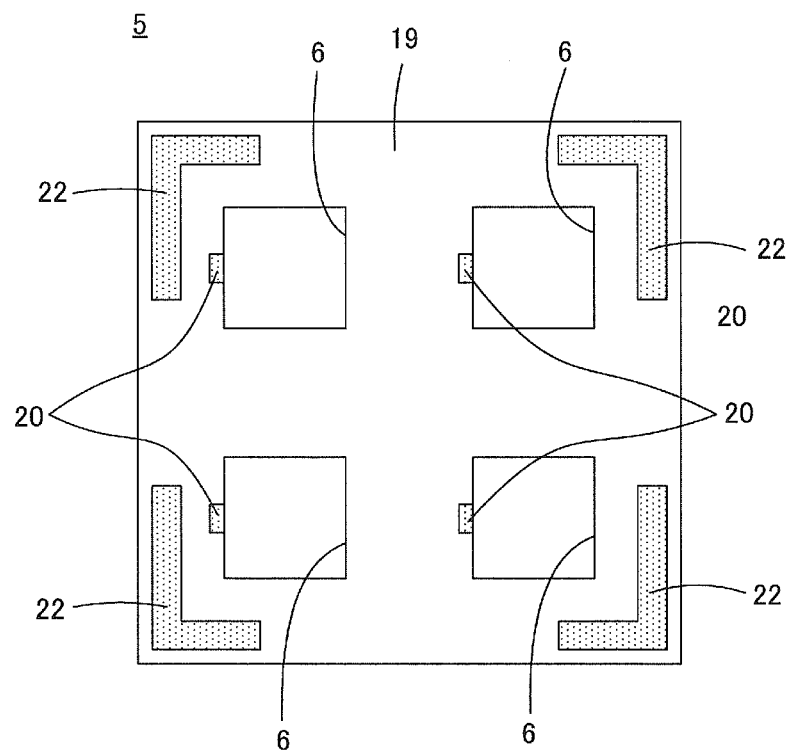
FIG. 4 is a bottom view of a wiring substrate included in the semiconductor device illustrated in FIG. 1.

As illustrated in FIG. 1 and FIG. 4, the wiring conductor 18 includes lead portions 20 on a lower principal surface 19 of the wiring substrate 5 and near the respective through holes 6. Each of the lead portions 20 is electrically connected to the corresponding outer conductor 14 on the heat dissipating substrate 4, preferably with a conductive bonding material 21, such as solder, for example, interposed therebetween.

Four bonding pads 22 paired with the respective four bonding pads 15 on the heat dissipating substrate 4 are preferably disposed on the lower principal surface 19 of the wiring substrate 5. The bonding pads 22 are preferably made mainly of, for example, copper or silver. As illustrated in FIG. 1, each of the bonding pads 22 is bonded to the corresponding bonding pad 15, preferably with a conductive bonding material 23, such as solder, for example, interposed therebetween. As a result, the wiring substrate 5 is mechanically secured to the heat dissipating substrate 4.

The wiring conductor 18 includes lead portions 25 and on an upper principal surface 24 of the wiring substrate 5 and near each of the through holes 6. Each upper-surface electrode 11 defining and serving as one of the source electrode and the gate electrode of the corresponding semiconductor element 2 is electrically connected via a wire 27 to the corresponding lead portion 25 of the wiring conductor 18, whereas each upper-surface electrode 12 defining and serving as the other of the source electrode and the gate electrode of the corresponding semiconductor element 2 is electrically connected via a wire 28 to the corresponding lead portion 26 of the wiring conductor 18.

A plurality of electronic components 29 are mounted on the upper principal surface 24 of the wiring substrate 5. Although not shown, the electronic components 29 are electrically connected to the wiring conductor 18. The electronic components 29 are, for example, capacitors, resistors, and ICs.

For example, the following is a non-limiting example of a method of manufacturing the semiconductor device 1 described above.

First, the semiconductor elements 2 are mounted on the heat dissipating substrate 4. For this, solder paste is applied to the outer conductors 14 on the heat dissipating substrate 4, and then the semiconductor elements 2 are placed at predetermined positions on the heat dissipating substrate 4. A high-temperature solder paste, such as Bi-0.15Cu solder paste, is used as the solder paste described above. Then, the solder paste is reflowed at a temperature of, for example, about 320° C. When an SiC or GaN semiconductor having a heat resistance temperature as high as about 300° C. is used to form the semiconductor elements 2, high-temperature solder is preferably used, as described above, for mounting of the semiconductor elements 2.

Next, the wiring substrate 5 is mounted on the heat dissipating substrate 4, and the electronic components 29 are mounted on the upper principal surface 24 of the wiring substrate 5. For this, solder paste is applied to the outer conductors 14 and the bonding pads 15 on the heat dissipating substrate 4, and also to predetermined conductive pads on the upper principal surface 24 of the wiring substrate 5. Then, the wiring substrate 5 and the electronic components 29 are placed on the solder paste applied. A low-temperature solder paste, such as M705 solder paste, is used as the solder paste described above. Then, the solder paste is reflowed at a temperature of, for example, about 240° C. When low-temperature solder is used to mount the wiring substrate 5 and the electronic components 29, the high-temperature solder used in mounting the semiconductor elements 2 can be prevented from melting again and flowing out during reflowing. If the wiring substrate 5 and the electronic components 29 are separately (or sequentially) reflowed with low-temperature solder, the low-temperature solder used first may melt again and flow out. This can be prevented when the wiring substrate 5 and the electronic components 29 are simultaneously reflowed. With low-temperature solder, even when a resin substrate is used as the wiring substrate 5, it is possible to reduce deterioration of the substrate.

Next, wire bonding is carried out between the semiconductor elements 2 and the wiring substrate 5, so that a connection is achieved via the wires 27 and 28.

The semiconductor device 1 is preferably manufactured as described above, for example.

The semiconductor device 1 provides the following operational effects.

First, a rise in temperature of the semiconductor elements 2 is significantly reduced and reliably prevented. Since the semiconductor elements 2 are mounted on the heat dissipating substrate 4 of low thermal resistance, heat produced during operation can be efficiently transferred to the heat dissipating substrate 4. Thus, a rise in temperature of the semiconductor elements 2 and the resulting deterioration of characteristics are significantly reduced and reliably prevented.

Additionally, the semiconductor device 1 supports higher current and has a significantly reduced size. For example, when the semiconductor elements 2 are FETs made of SiC or GaN semiconductor, the heat resistance temperature of the semiconductor elements 2 is at least about 200° C. and may even be as high as about 300° C. or about 500° C., for example. When the semiconductor elements 2 have a high heat resistance temperature, it is possible to supply high current to the semiconductor elements 2. The semiconductor device 1 includes the wiring substrate 5, which preferably is an LTCC substrate or a resin substrate, for example. Therefore, the wiring conductor 18 is disposed inside the wiring substrate 5, the wiring conductor 18 being made mainly of silver or copper having a relatively low electrical resistivity but a relatively low melting point. Thus, the semiconductor device 1 supports higher current and has a significantly reduced size, as the wiring conductor 18 can be disposed inside the wiring substrate 5. The wiring conductor 18 preferably is, for example, about 100 μm thick or more at places where high current is particularly required.

Also, the semiconductor device 1 supports the semiconductor elements 2 each having the lower-surface electrode 10 on the mounting surface 9, which is its lower surface, where there is a flow of electricity. This is because at least one of the principal surfaces of the heat dissipating substrate 4 including the semiconductor elements 2 mounted thereon is preferably defined by an electric insulator, on which the outer conductors 14 connected to the respective lower-surface electrodes 10 on the semiconductor elements 2 are arranged to be electrically insulated from one another.

Figure 5:
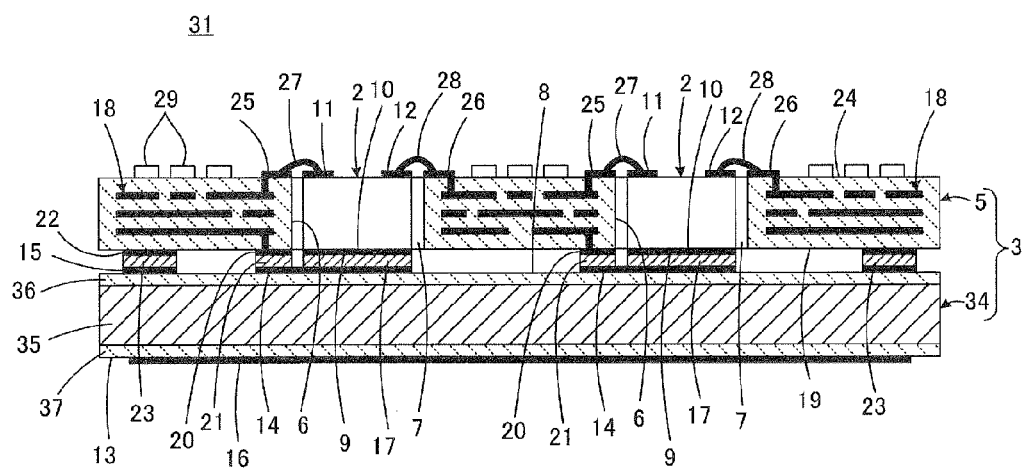
FIG. 5 is a cross-sectional view of a semiconductor device according to a second preferred embodiment of the present invention.

A semiconductor device 31 according to a second preferred embodiment of the present invention will now be described with reference to FIG. 5. In FIG. 5, components identical to those illustrated in FIG. 1 are given the same reference numerals, and thus overlapping description will be omitted.

In the semiconductor device 31 illustrated in FIG. 5, the substrate assembly 3 preferably includes a heat dissipating substrate 34 and the wiring substrate 5. The configuration of the heat dissipating substrate 34 is different from that of the heat dissipating substrate 4 according to the first preferred embodiment. The other configurations are preferably the same or substantially the same as those in the first preferred embodiment.

The heat dissipating substrate 34 preferably includes a metal base substrate that includes a metal plate 35 and ceramic insulating layers 36 and 37 disposed on both principal surfaces of the metal plate 35. The metal plate 35 is preferably made of metal having a relatively high thermal conductivity, such as silver or copper, for example. The heat dissipating substrate 34 preferably has a thermal conductivity of about 50 W/(m·K) or more, for example. The heat dissipating substrate 34 can more easily achieve a higher thermal conductivity than the heat dissipating substrate 4 of the first preferred embodiment.

The outer conductors 14 and the bonding pads 15 are disposed on the ceramic insulating layer 36 that defines the upper principal surface 8 of the heat dissipating substrate 34. The bonding pad 16 is disposed on the ceramic insulating layer that defines the lower principal surface 13 of the heat dissipating substrate 34.

For example, the heat dissipating substrate 34 is preferably obtained by forming the ceramic insulating layers 36 and 37 of LTCC of about 100 μm thickness on both the principal surfaces of the metal plate 35 formed by a copper plate of about 0.80 mm thickness, forming the outer conductors 14 and the bonding pads 15 of copper of about 0.3 mm thickness on the ceramic insulating layer 36, and forming the bonding pad 16 of copper of about 0.3 mm thickness on the ceramic insulating layer 37.

Alternatively, the heat dissipating substrate 34 may have a structure in which the ceramic insulating layer 37 and the bonding pad 16 are omitted to allow the lower principal surface of the metal plate 35 to be exposed. Instead of ceramic insulating layers, insulating layers of resin may be formed on the principal surfaces of the metal plate 35. The resin used here is preferably one having a high thermal resistance, such as polyimide, and contains a filler of high thermal conductivity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A semiconductor device comprising:
a heat dissipating substrate having a relatively high thermal conductivity, the heat dissipating substrate including first and second principal surfaces, at least one of the first and second principal surfaces including an electric insulator provided with an outer conductor thereon;
a wiring substrate mounted on the at least one of the first and second principal surfaces of the heat dissipating substrate, having a thermal conductivity lower than that of the heat dissipating substrate, and including a wiring conductor mainly including silver or copper and located inside the wiring substrate, the wiring conductor being electrically connected to the outer conductor; and
a semiconductor element that produces heat during operation, mounted on the at least one of the first and second principal surfaces of the heat dissipating substrate, and including a lower-surface electrode located on a mounting surface facing the at least one of the first and second principal surfaces of the heat dissipating substrate, the lower-surface electrode being electrically connected via the outer conductor to the wiring conductor; wherein
the first principal surface of the heat dissipating substrate is electrically insulated from the second principal surface of the heat dissipating substrate.

2. The semiconductor device according to claim 1, wherein the wiring substrate includes a through hole passing therethrough in a direction perpendicular or substantially perpendicular to the at least one of the first and second principal surfaces, and the semiconductor element is disposed in the through hole.

3. The semiconductor device according to claim 2, wherein a plurality of the semiconductor elements are provided, the wiring substrate includes a plurality of the through holes, and the plurality of semiconductor elements are disposed in the respective through holes.

4. The semiconductor device according to claim 2, wherein the through hole is larger than the semiconductor element such that a gap is provided between an inner periphery of the through hole and an outer periphery of the semiconductor element.

5. The semiconductor device according to claim 1, wherein the semiconductor element includes an upper-surface electrode on a surface opposite the mounting surface, and the upper-surface electrode is electrically connected to the wiring conductor via a wire.

6. The semiconductor device according to claim 1, wherein the semiconductor element has a heat resistance temperature of about 200° C. or higher.

7. The semiconductor device according to claim 1, wherein the semiconductor element is a bare semiconductor element.

8. The semiconductor device according to claim 1, wherein the heat dissipating substrate includes any one of an aluminum nitride substrate, an alumina substrate, a silicon nitride substrate, and a metal base substrate including a metal plate including a ceramic or resin insulating layer on at least one of the first and second principal surfaces thereof, and the wiring substrate includes either a low temperature co-fired ceramic substrate or a resin substrate.

9. The semiconductor device according to claim 1, further comprising at least one electronic component mounted on a principal surface of the wiring substrate.

10. The semiconductor device according to claim 9, wherein the at least one electronic component is at least one of capacitor, a resistor, and an IC.

11. The semiconductor device according to claim 1, wherein the semiconductor element is a Field Effect Transistor.

12. The semiconductor device according to claim 1, wherein the heat dissipating substrate has a thermal conductivity of about 10 W/(m·K) or more.

13. The semiconductor device according to claim 1, further comprising at least one bonding pad arranged to fix the heat dissipating substrate and the wiring substrate to each other.

14. The semiconductor device according to claim 1, wherein the wiring substrate 5 has a thermal conductivity of about 5 W/(m·K) or less.

15. The semiconductor device according to claim 1, wherein the wiring conductor is about 100 µm thick or more.

16. The semiconductor device according to claim 1, wherein the heat dissipating substrate includes a metal base substrate that includes a metal plate and ceramic insulating layers disposed on both principal surfaces of the metal plate.

17. The semiconductor device according to claim 16, wherein the metal plate is made of silver or copper.

18. The semiconductor device according to claim 16, wherein the heat dissipating substrate has a thermal conductivity of about 50 W/(m·K) or more.

19. The semiconductor device according to claim 1, wherein the lower-surface electrode of the semiconductor element is directly opposed to and facing the at least one of the first and second principal surfaces of the heat dissipating substrate.

20. The semiconductor device according to claim 1, wherein the heat dissipating substrate, the electric insulator, the outer conductor, and the wiring substrate are arranged in this order from bottom to top.

* * * * *